United States Patent
Popovici et al.

(10) Patent No.: US 11,968,841 B2
(45) Date of Patent: Apr. 23, 2024

(54) FERROELECTRIC DEVICE BASED ON HAFNIUM ZIRCONATE AND METHOD OF FABRICATING THE SAME

(71) Applicant: IMEC vzw, Leuven (BE)

(72) Inventors: Mihaela Ioana Popovici, Haasrode (BE); Amey Mahadev Walke, Heverlee (BE); Jan Van Houdt, Bekkevoort (BE)

(73) Assignee: IMEC vzw, Leuven (BE)

( * ) Notice: Subject to any disclaimer, the term of this patent is extended or adjusted under 35 U.S.C. 154(b) by 181 days.

(21) Appl. No.: 17/650,154

(22) Filed: Feb. 7, 2022

(65) Prior Publication Data
US 2022/0254795 A1    Aug. 11, 2022

(30) Foreign Application Priority Data

Feb. 8, 2021   (EP) ..................................... 21155738

(51) Int. Cl.
*H10B 53/30*   (2023.01)
*H01L 29/78*   (2006.01)
*H01L 49/02*   (2006.01)

(52) U.S. Cl.
CPC ............. *H10B 53/30* (2023.02); *H01L 28/40* (2013.01); *H01L 29/78391* (2014.09)

(58) Field of Classification Search
CPC ....... H10B 51/30; H10B 53/30; H01L 29/516; H01L 29/517; H01L 29/78391; G11C 11/22; G11C 11/221
See application file for complete search history.

(56) References Cited

U.S. PATENT DOCUMENTS

2019/0371802 A1* 12/2019 Morris ............... G11C 11/2275
2020/0286985 A1   9/2020 Lim et al.
2021/0343731 A1* 11/2021 Chen ..................... H10B 53/30
(Continued)

FOREIGN PATENT DOCUMENTS

DE   102019118100 A1 *  4/2020 ......... H01L 21/8239
WO   WO-2019220796 A1 * 11/2019 ........... G11C 11/221
WO   WO-2022110009 A1 *  6/2022

OTHER PUBLICATIONS

Extended European Search Report dated Jul. 19, 2021 for European Application No. 21155738.4 in 8 pages.
(Continued)

*Primary Examiner* — Matthew E Warren
(74) *Attorney, Agent, or Firm* — Knobbe, Martens, Olson & Bear, LLP

(57) ABSTRACT

A ferroelectric device, for instance, a metal-ferroelectric-metal (MFM) capacitor, a ferroelectric random access memory (Fe-RAM), or a ferroelectric field effect transistor (FeFET), is provided. In one aspect, the ferroelectric device is based on hafnium zirconate (HZO). The ferroelectric device can include a first electrode and a second electrode, and a doped HZO layer, which is arranged between the first electrode and the second electrode. The doped HZO layer can include a ferroelectric layer and at least two non-zero remnant polarization charge states. The doped HZO layer can be doped with at least two different elements selected from the lanthanide series, or with a combination of at least one element selected from the lanthanide series and at least one rare earth element.

21 Claims, 8 Drawing Sheets

(56) References Cited

U.S. PATENT DOCUMENTS

2021/0375937 A1* 12/2021 Wu .................. H10B 51/10
2023/0209835 A1*  6/2023 Wu .................. H01L 29/513
                                                  257/295

OTHER PUBLICATIONS

Kim et al., "Ferroelectric $Hf_{0.5}Zr_{0.5}O_2$ Thin Films: A Review of Recent Advances," *JOM* 71(1):246-255 (2019).
Schroeder et al., "Lanthanum-Doped Hafnium Oxide: A Robust Ferroelectric Material," *Inorg. Chem.* 57(5):2752-2765 (2018).

* cited by examiner

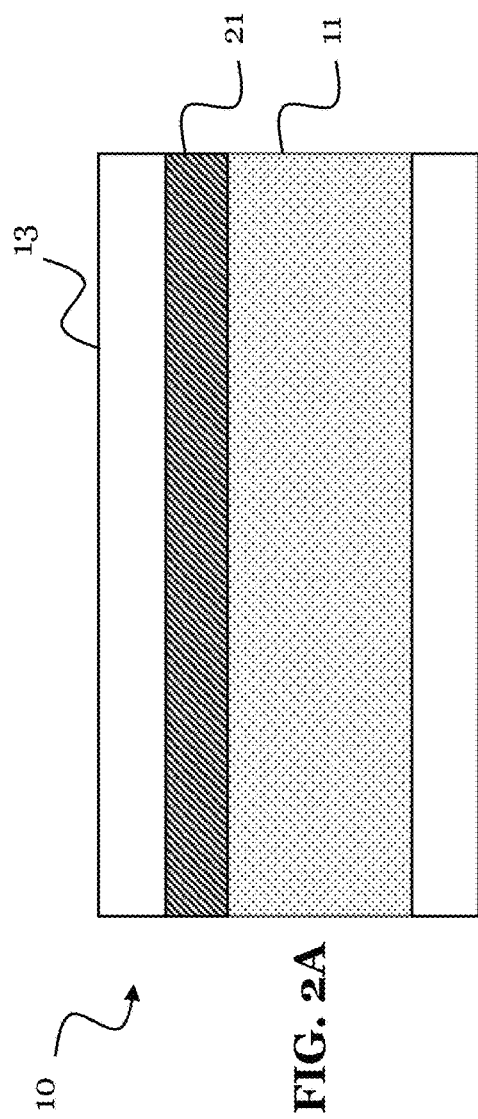
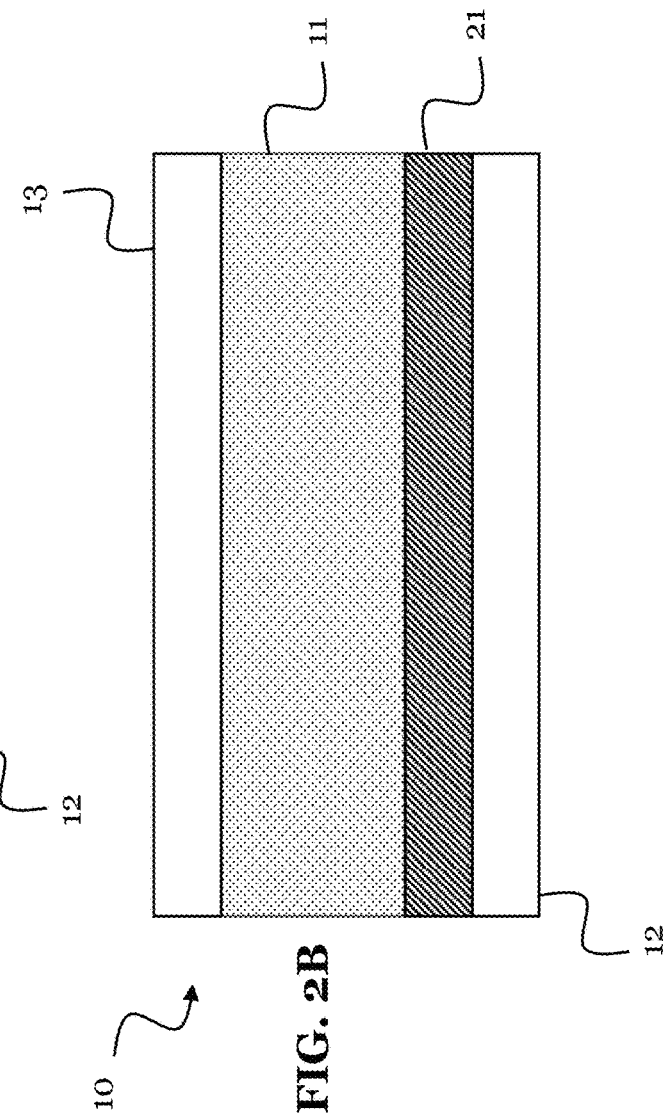
FIG. 2A
FIG. 2B

FERROELECTRIC DEVICE BASED ON HAFNIUM ZIRCONATE AND METHOD OF FABRICATING THE SAME

CROSS-REFERENCE TO RELATED APPLICATIONS

This application claims foreign priority to European Patent Application No. EP 21155738.4, filed Feb. 8, 2021, the content of which is incorporated by reference herein in its entirety.

BACKGROUND

Technical Field

The disclosed technology relates to a ferroelectric device, for instance, to a metal-ferroelectric-metal (MFM) capacitor, a ferroelectric random access memory (Fe-RAM), or a ferroelectric field effect transistor (FeFET). The ferroelectric device can be based on hafnium zirconate (HZO), for example, it can include a HZO layer. The present disclosure also relates to a method of manufacturing the HZO-based ferroelectric device.

Description of the Related Technology

A non-volatile data storage (generally, a memory device) can be obtained using ferroelectric oxides, due to their capacity to store binary information in two distinct polarization states. These polarization states arise, for example, in hafnia and in HZO. The cause of these polarization states can be the formation of a non-centrosymmetric polar orthorhombic Pca21 phase ("orthorhombic phase"), with four oxygen atoms in a unit cell that have two stable positions.

In various instances, a large memory window requires a high remnant polarization (2Pr) of the ferroelectric oxide, which should be at least 10 $\mu C/cm^2$, and also requires a high fatigue endurance of at least 1E+9 cycles for 10 years lifetime of the memory device. The fatigue is a degradation phenomenon in the ferroelectric oxide, which can cause the remnant polarization of the ferroelectric oxide to decrease. The endurance is a measure of how many times the ferroelectric oxide can be cycled (for example, switched between the two distinct polarization states), until significant fatigue sets in.

To stabilize the orthorhombic phase, which can induce the ferroelectricity, different elements such as lanthanum (La), aluminum (Al), yttrium (Y), gadolinium (Gd), and strontium (Sr) have been examined as individual dopants for hafnium oxide ($HfO_2$) as a ferroelectric oxide matrix. However, hafnium oxide ($HfO_2$) generally has shown limited endurance and can require high annealing temperatures for crystallization, which limits its practical applications. On the other hand, HZO has lower crystallization temperature, making it suitable for back end of line applications and importantly shows superior endurance compared to $HfO_2$. For HZO as a ferroelectric oxide matrix, only lanthanum has been examined as dopant. Lanthanum is known to reduce a leakage current, and also allows improving the endurance of the ferroelectric oxide up to 1E+11 cycles. This makes lanthanum generally a good candidate for non-volatile memory applications. However, with lanthanum dopant, the fatigue mechanism decreasing the polarization below 10 $\mu C/cm^2$ can be expected above 1E+11 cycles. Moreover, the beneficial effect of lanthanum on the endurance of polycrystalline films may be accompanied by degradation of retention, which would degrade the performance of the device.

Therefore, there is a need to improve current state of the art ferroelectric devices, for endurance, retention and/or or wake-up behavior.

SUMMARY OF CERTAIN INVENTIVE ASPECTS

In view of the above-mentioned challenges and disadvantages, embodiments of the disclosed technology aim to provide a HZO-based ferroelectric device that shows a high endurance of above 1E+9 and beyond 1E+11 cycles, wherein the remnant polarization is maintained at a high level of at least 10 $\mu C/cm^2$. Various embodiments of the ferroelectric device should also show a good (for example, fast) wake-up behavior from the pristine state (no cycling yet). Another goal of the present disclosure is to provide embodiments of a method of efficiently and reliably manufacturing such a ferroelectric device.

These and other objectives can be achieved by the embodiments of the disclosed technology provided in the enclosed independent claims. Advantageous implementations of these embodiments are also provided in the dependent claims.

The embodiments of the disclosed technology are based on the finding that the endurance of a HZO-based ferroelectric device can be significantly increased by providing a co-doped HZO layer, doped with at least two elements, instead of only one dopant. For instance, a combination of lanthanum and gadolinium, or a combination of lanthanum and yttrium may be used in the HZO matrix to provide the doped HZO layer. The doped HZO layer may be a single layer, or may be a bi-layer of doped HZO and one of zirconium oxide ($ZrO_2$), hafnium oxide ($HfO_2$), Zr-rich HZO, and Hf-rich HZO.

A first non-limiting aspect of the present disclosure can provide a ferroelectric device, including: a first electrode and a second electrode; a doped HZO layer, which is arranged between the first electrode and the second electrode, wherein the doped HZO layer is a ferroelectric layer and has at least two non-zero remnant polarization charge states; wherein the doped HZO layer is doped with at least two different elements selected from the lanthanide series, or with a combination of at least one element selected from the lanthanide series and at least one rare earth element.

For instance, the following combinations of doping elements may be used to dope HZO to obtain the doped HZO layer: two elements selected from the lanthanide series (for example, two lanthanides); two lanthanides plus one rare earth; one lanthanide plus two rare earths; one lanthanide plus one rare earth. Also more than two different elements may be selected for obtaining the doped HZO layer, for example, three or more dopants may be used for doping the HZO.

The use of at least two doping elements can allow obtaining a doped HZO layer with a predominantly orthorhombic and tetragonal phase content, while the monoclinic phase can be reduced and/or minimized in the doped HZO layer. This can allow overcoming several limitations of conventional HZO-based ferroelectric devices.

In particular, embodiments of ferroelectric devices of the disclosed technology, for example the ferroelectric device of the first aspect, show a fast wake-up behavior. Further, the ferroelectric device of the first aspect, for example, using a combination of La and Gd dopants, shows a high endurance (larger than 1E+10 cycles) with a nearly fatigue free behavior and thereby maintains a high remnant polarization (of at least 14 μC/cm$^2$). In another example, La and Y co-doped layers can show, as well, an endurance of at least 1E+11 cycles, with a fatigue free response and a 2Pr of at least 15 μC/cm$^2$. Due to the co-doping of the HZO, a good trade-off between the remnant polarization, the endurance/fatigue, and the wake-up behavior of the ferroelectric device is possible. Depending on the required application, it is also possible to control at least one or more of the remnant polarization, the coercive field, the endurance/fatigue, the retention, and the wake-up behavior in the doped HZO layer as desired.

For a HZO-based ferroelectric device, which is doped with just lanthanum, a wake-up behavior is significantly delayed compared to embodiments of ferroelectric devices of the disclosed technology, for example the ferroelectric device of the first aspect. Further, for an example HZO-based ferroelectric device, which is doped with just gadolinium, the wake-up behavior is similar to that of the ferroelectric device of the first aspect, but it shows at the same time a lower remnant polarization, in particular, at a high number of cycles.

In an example implementation of the ferroelectric device, the doped HZO layer is doped with at least lanthanum and gadolinium.

The lanthanum plus gadolinium may be at least partially crystallized. With these co-dopants, a fatigue free behavior of the ferroelectric device up to 1+E11 cycles can be observed. Further, in various instances, no impact of leakage is seen. The remnant polarization can be maintained at 14 μC/cm$^2$ or even more. Further, since the sum of the orthorhombic and tetragonal phases can be larger for the co-doped HZO layer (La, Gd) than for a HZO layer with only gadolinium, for example, there is more potential for further wake-up through cycling.

Another possibility would be to co-dope the HZO layer with at least lanthanum and praseodymium. Another possible dopant combination for obtaining the doped HZO layer is lanthanum, praseodymium, and gadolinium.

In another example implementation, a combination of at least one lanthanide and at least one rare earth is possible. For example, the doped HZO layer can be doped with at least lanthanum and with at least yttrium or scandium.

In an example implementation of the ferroelectric device, a total dopant concentration in the doped HZO layer is equal to or smaller than 2 atomic %, for example, is in a range of 0.7 to 1.8 atomic %.

In some instances, this doping concentration range can provide an optimal "trade-off" between the remnant polarization, the wake-up delay, and the endurance, retention and fatigue of the ferroelectric device.

In an example implementation of the ferroelectric device, the thickness of the doped HZO layer is between 5 and 13 nm, for example, between 8.5 and 12.5 nm.

This can be particularly beneficial for forming a Fe-RAM or FeFET device.

In an example implementation of the ferroelectric device, the doped HZO layer has a hafnium content, Hf/(Hf+Zr)%, in a range of 40%-70%, for example, in a range of 40%-60%.

For example, the HZO layer may be stoichiometric (50%), or may be Hf-rich (51-70%), or may be Zr-rich or Hf-deficient (40-49%). A Zr-rich doped HZO layer may lead to a lower remnant polarization of the ferroelectric device, but may increase the endurance. The Hf-rich doped HZO layer may lead to a higher remnant polarization and earlier wake-up of the ferroelectric device, which may be due to a larger orthorhombic phase content. However, also a faster fatigue may be experienced, due to a higher monoclinic phase content. In an example, the addition of a rare earth element alone or in combination with a lanthanide delays the fatigue, allowing to reach high endurance (at least 1E+10 cycles) with a higher 2Pr as compared to stoichiometric HZO (50%).

In an example implementation, the ferroelectric device further includes an interfacial oxide layer arranged between the one of the electrodes and the doped HZO layer; wherein the interfacial oxide layer includes a layer of $ZrO_2$ or $HfO_2$ or Zr rich HZO or Hf rich HZO.

For example, the interfacial oxide layer may be located between the first electrode (for example, bottom electrode) and the doped HZO layer. In this case, the interfacial oxide layer is arranged below the HZO layer, and may also be referred to as a seed layer. The interfacial oxide layer may also be located between the second electrode (for example, top electrode) and the doped HZO layer. In this case, the interfacial oxide layer is arranged on top of the HZO layer. The interfacial oxide layer may affect the orthorhombic/tetragonal phase ratio in the doped HZO layer. For instance, an interfacial oxide layer (for example, $ZrO_2$) arranged on top of the HZO layer may lead to an increased orthorhombic phase content, larger than that of the tetragonal phase, and much larger than that of the monoclinic phase. This may result in a higher remnant polarization of the ferroelectric device. When the interfacial oxide layer (for example, $ZrO_2$) is arranged below the HZO layer, the remnant polarization may be lower while the cycling yield (endurance) is better/higher. Further, a nucleation of HZO with favorable grain size can be achieved with the interfacial oxide layer (for example, $ZrO_2$), resulting in extended endurance.

In an example implementation of the ferroelectric device, the interfacial oxide layer is a zirconium dioxide layer; and the hafnium content, Hf/(Hf+Zr)%, of the doped HZO layer is in a range of 50-70%.

For example, in the case of a $ZrO_2$, the HZO layer may be either stoichiometric or Hf-rich. For the Hf-rich HZO, there may be a larger percentage of the orthorhombic phase. This, in particular in combination with the $ZrO_2$ and the co-doping, can improve the endurance of the ferroelectric device.

In an example implementation of the ferroelectric device, the interfacial oxide layer, $ZrO_2$ or $HfO_2$ or Zr-rich HZO or Hf-rich HZO, is doped with at least one element from the lanthanide series and/or a rare earth element.

For instance, the interfacial oxide layer may be made of a zirconium oxide doped with lanthanum. The interfacial oxide layer may also be made of a zirconium oxide doped with yttrium, or of a zirconium oxide doped with lanthanum and yttrium, or of a zirconium oxide doped with lanthanum plus gadolinium or just with gadolinium.

In an example implementation of the ferroelectric device, the first electrode includes titanium nitride, molybdenum, ruthenium, or tungsten nitride; and/or the second electrode includes titanium nitride, molybdenum, ruthenium, or tungsten nitride.

Generally, the electrodes may be made of metal or may be conductive oxide electrodes. The electrodes can include a broad range of combinations, and are not limited to the ones mentioned above. The electrodes may, however, influence the characteristic of the ferroelectric device. The electrode material may, in particular, impact the nucleation rate of the HZO during its deposition, wherein less nuclei may lead to larger HZO grains and thus to a larger remnant polarization. For instance, a titanium nitride electrode may provide an optimal trade-off between remnant polarization and endurance. In terms of the grain size, tungsten nitride may lead to larger grains than molybdenum, which can lead to larger grains than titanium nitride, which can lead to larger grains than beryllium.

In an example implementation of the ferroelectric device, a remnant polarization of the doped HZO layer of at least 10 $\mu C/cm^2$ is maintained when the endurance is equal to or greater than 1E+5 cycles.

An endurance of 1E+11 cycles is, for example, possible with co-doping the HZO using lanthanum and gadolinium or lanthanum and yttrium, wherein the remnant polarization is in the order of 14 $\mu C/cm^2$ or 15-16 $\mu C/cm^2$, respectively.

In an example implementation of the ferroelectric device, the ferroelectric device is a metal-ferroelectric-metal capacitor; and/or the ferroelectric device is a Fe-RAM; and/or the ferroelectric device is a FeFET.

The ferroelectric device, particularly the FeFET, may include a combination of the doped HZO layer with an indium gallium zinc oxide (IGZO) layer or indium tin oxide (ITO) layer. For example, the doped HZO and the IGZO layer or ITO layer may be arranged between the first and second electrodes, and may be arranged on top of each other. In another example, a combination of $ZrO_2$ or $HfO_2$ or Zr-rich HZO or Hf-rich HZO, undoped or doped with at least one element from the lanthanide series and/or a rare earth element and the IGZO layer or ITO layer may be arranged between the first and second electrodes, and may be arranged on top of each other.

A second non-limiting aspect of the disclosure can provide a method of fabricating a ferroelectric device, the method including: forming at least a doped HZO layer between a first electrode and a second electrode, wherein the doped HZO layer is a ferroelectric layer and has at least two non-zero remnant polarization charge states; wherein the forming of the doped HZO layer includes doping HZO with at least two different elements from the lanthanide series, or with a combination of at least one element selected from the lanthanide series and at least one rare earth element.

In an example implementation of the method, the forming of the HZO layer includes doping the HZO with at least lanthanum and gadolinium, or with at least lanthanum and yttrium.

In an implementation of the method, the doped HZO layer is formed in-situ by depositing a plurality of layers grown by atomic layer deposition of HZO and of the dopants, respectively, by alternating the layers of HZO and the layers of each dopant or of multiple dopants.

For instance, the doped HZO layer can be formed by depositing un-doped HZO layer, then a first dopant layer (atomic layer of a first dopant) on the HZO layer, then another un-doped HZO layer, and then a second dopant layer (atomic layer of a second dopant) on the un-doped HZO layer, and then another un-doped HZO layer, and so on. The doped HZO layer may also be formed by depositing an un-doped HZO layer, then subsequently a first dopant layer and a second dopant layer on the un-doped HZO layer, then another un-doped HZO layer, and so on. In either case, the forming of the doped HZO layer may also start with the first dopant layer or with the second dopant layer at the very bottom.

A specific example of forming the doped HZO layer is to provide two atomic layers of gadolinium and one atomic layer of lanthanum or two atomic layers of lanthanum and one atomic layer of gadolinium between each two subsequently formed atomic layers of un-doped HZO.

Another specific example of forming the doped HZO layer is to provide two atomic layers of yttrium and one atomic layer of lanthanum, or two atomic layers of lanthanum and one atomic layer of yttrium, between each two subsequently formed atomic layers of un-doped HZO.

In an implementation of the method, the layers of the HZO and of the dopants are each deposited at a temperature in a range of 150° C.-400° C.

In some instances, each of the above layers may be deposited at a different temperature, as long as all the layers are deposited within the specified temperature range. For example, the atomic layers of the un-doped HZO may each be deposited at a temperature in a range of around 280° C.-320° C., for example, 300° C., and the atomic layers of the dopants gadolinium and lanthanum may each be provided at a temperature of about 230° C.-270° C., for example, 250° C. Different reactors may be used to provide these different temperature ranges or temperatures.

In an implementation, the method further includes annealing the doped HZO layer at a temperature in a range of 400° C.-650° C., for example, in a range of 500-550° C.

After the annealing, the HZO of the doped HZO layer may be completely crystallized. After the annealing, larger grains may be present in a Hf-rich HZO layer, due to a lower amount of nuclei formed at the deposition of the HZO.

The method of the second non-limiting aspect can achieve the same or similar advantages as the ferroelectric device of the first non-limiting aspect and may be extended by respective implementations as described above for the ferroelectric device of the first aspect.

BRIEF DESCRIPTION OF THE DRAWINGS

The above described aspects and implementations are explained in the following description of embodiments with respect to the enclosed drawings:

FIG. 2A and FIG. 2B each shows a ferroelectric device according to an embodiment of the disclosed technology with an interfacial oxide layer.

DETAILED DESCRIPTION OF CERTAIN ILLUSTRATIVE EMBODIMENTS

Figure 1:
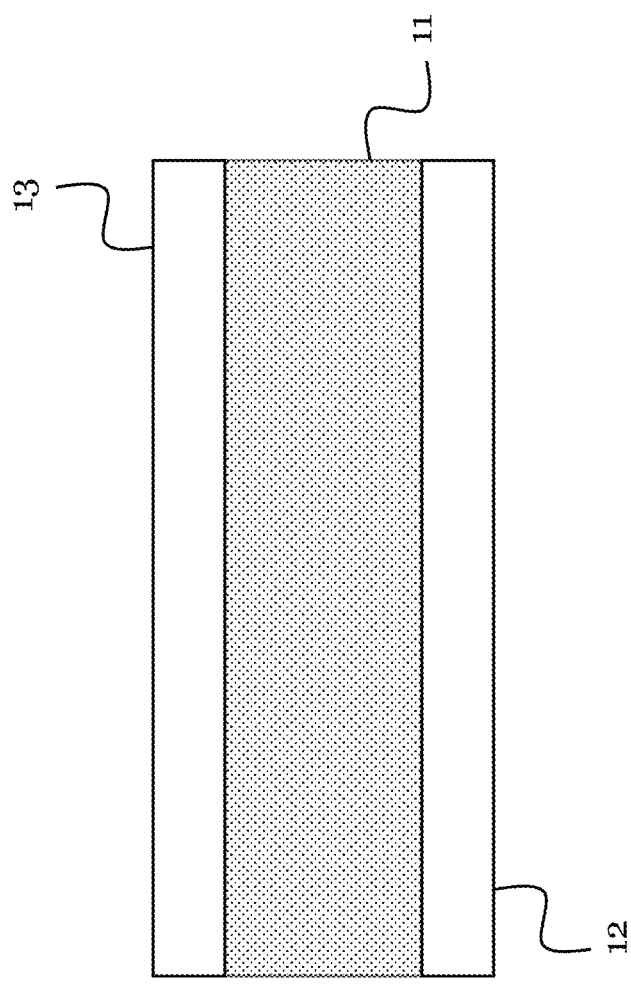
FIG. 1 shows a ferroelectric device according to an embodiment of the disclosed technology.

FIG. 1 shows schematically a layer structure for an example ferroelectric device 10 according to an embodiment of the disclosed technology. The ferroelectric device 10 may be a metal-ferroelectric-metal capacitor, a Fe-RAM, or a FeFET. The layer structure shown in FIG. 1 may be a part of the ferroelectric device 10, or may be the ferroelectric device 10.

As shown, the ferroelectric device 10 includes a first electrode 12 and a second electrode 13. In some instances, the first electrode 12 may also be referred to as bottom electrode, and the second electrode 13 may also be referred to as a top electrode. Thereby, top and bottom may relate to a fabrication direction or growth direction of the ferroelectric device 10. Both electrodes 12, 13 may be made of a metal or of a conductive oxide, as already mentioned above.

The ferroelectric device 10 further includes a doped HZO layer 11, which is arranged between the first electrode 12 and the second electrode 13. In particular, as shown in FIG. 1, the HZO layer 11 may be sandwiched by the first electrode 12 and the second electrode 13, for example, it may be the only layer arranged between the two electrodes 12, 13. In this case, the HZO layer 11 may be provided on the first electrode 12, and the second electrode 13 may be provided on the HZO layer 11. A thickness (in growth direction) of the doped HZO layer may be between 5-13 nm, and/or between 8.5-12.5 nm.

The doped HZO layer 11 can be a ferroelectric layer and have at least two non-zero remnant polarization charge states. In particular, the doped HZO layer 11 can be doped with at least two different elements, which may be selected from the lanthanide series. Alternatively, the doped HZO layer 11 can be doped with a combination of at least one element selected from the lanthanide series and at least one rare earth element. Generally, the at least two elements (dopants) in the doped HZO layer 11 may include one or more of lanthanum, gadolinium, yttrium, scandium, praseodymium.

FIG. 2A and FIG. 2B each show a ferroelectric device 10 according to an embodiment of the disclosed technology, which builds on the embodiment shown in FIG. 1. Same parts of the ferroelectric device 10 shown in FIG. 1 and FIGS. 2A-2B share the same reference signs, and may be implemented likewise. Accordingly, the ferroelectric device 10 shown in each of FIGS. 2A-2B also includes the doped HZO layer 11 and the two electrodes 12 and 13.

In addition, the ferroelectric device 10 shown in each of FIGS. 2A-2B includes an interfacial oxide layer 21, which is arranged between one of the electrodes 12, 13 and the doped HZO layer 11. In particular, in FIG. 2A, the interfacial oxide layer 21 is arranged between the doped HZO layer 11 and the second electrode 13, wherein it may be sandwiched by the doped HZO layer 11 and the second electrode 13. In FIG. 2B, the interfacial oxide layer 21 is arranged between the doped HZO layer 11 and the first electrode 12, wherein it may be sandwiched by the doped HZO layer 11 and the first electrode 12.

The interfacial oxide layer 21 may include a layer of $ZrO_2$, or of $HfO_2$, or of Zr-rich HZO, or of Hf-rich HZO. The interfacial oxide layer 21 may be doped with at least one element from the lanthanide series and/or at least one rare earth element. For example, the interfacial oxide layer 21 may be a $ZrO_2$ layer and the doped HZO layer 11 may be stoichiometric (50%) or Hf rich (>50%).

Figure 3:
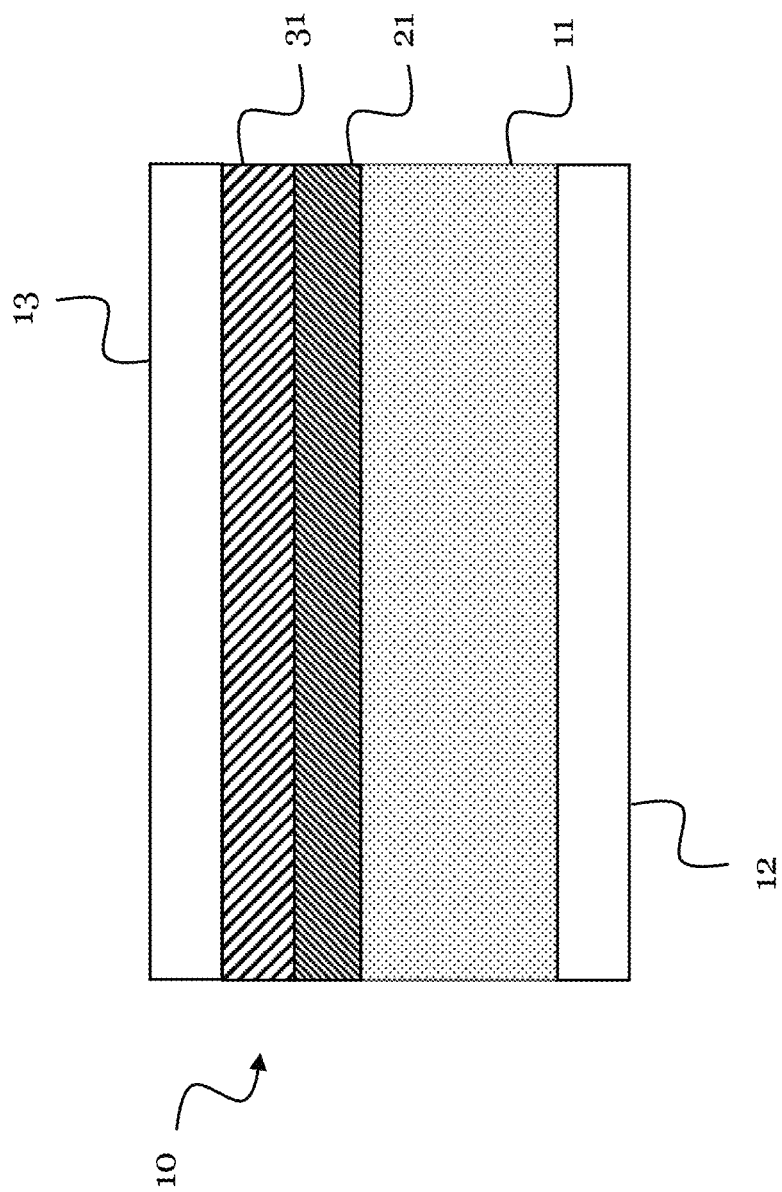
FIG. 3 shows a ferroelectric device according to an embodiment of the disclosed technology with an interfacial oxide layer and an additional layer.

FIG. 3 shows a ferroelectric device 10 according to an embodiment of the disclosed technology, which builds on the embodiments shown in FIG. 1 and FIGS. 2A-2B. Same parts of the ferroelectric device 10 in each of FIGS. 2A-2B and FIG. 3 share the same reference signs and may be implemented likewise. Accordingly, the ferroelectric device 10 shown in FIG. 3 also includes the doped HZO layer 11, the two electrodes 12 and 13, and the interfacial oxide layer 21.

In addition, the ferroelectric device 10 shown in FIG. 3 includes an additional layer 31. The additional layer 31 may form a bi-layer with the interfacial oxide layer 21. For example, the interfacial oxide layer 21 and the additional layer 31 may be provided on top of each other (either one may be at the bottom), and may together be arranged between the doped HZO layer 11 and one of the electrodes 12, 13. As shown in FIG. 3, the interfacial oxide layer 21 and the additional layer 31 may be arranged between the doped HZO layer 11 and the second electrode 13. Thereby, the interfacial oxide layer 21 may be arranged on the doped HZO layer 11, the additional layer 31 may be arranged on the interfacial oxide layer 21, and the second electrode 13 may be arranged on the additional layer 31.

In an example, the additional layer 31 may be a semiconductor oxide layer, like an IGZO layer or ITO layer. In another example, the additional layer 31 may be a 2D semiconductor layer, like graphene or MX2 (for example, $MoS_2$).

For example, the interfacial oxide layer 21 may be an $ZrO_2$, or of $HfO_2$, or of Zr-rich HZO, or of Hf-rich HZO layer. The additional layer 31 may be an IGZO layer, an IZO layer, an ITO layer, or a 2D semiconductor layer like graphene or MX2 (for example, $MoS_2$). The ferroelectric device 10 may be a FeFET. The first electrode 12 may be a titanium nitride layer electrode, and the second electrode 13 may be titanium or an aluminum electrode. Instead of, or in addition to, the second electrode 13, the ferroelectric device 10 may also include a silicon or other semiconductor layer.

In all the ferroelectric devices 10 described above with respect to FIGS. 1-3, a total dopant concentration in the doped HZO layer 11 may be equal to or smaller than 2 atomic %, for example, it may be in a range of 0.7-1.8 atomic %. For instance, for a combination of lanthanum and gadolinium, an optimal dopant concentration may be 0.8-1.8 atomic %, which can correlate to predominantly orthorhombic and tetragonal content, and can reduce and/or minimize the monoclinic phase.

Generally, in a ferroelectric device 10 according to an embodiment of the disclosed technology, a remnant polarization of the doped HZO layer 11 can be maintained at 10 $\mu C/cm^2$ or even higher, when the endurance is equal to or greater than 1E+5 cycles, or greater than 1E+9 cycles, or even greater than 1E+11 cycles. In particular, an almost fatigue free behavior with a remnant polarizations of above 14 $\mu C/cm^2$ or a fatigue free behavior with a remnant polarization of at least 15 $\mu C/cm^2$ can be achieved in the ferroelectric device 10 according to an embodiment of the disclosed technology (for example, as demonstrated below with results shown in FIG. 4-FIG. 7).

Figure 4:
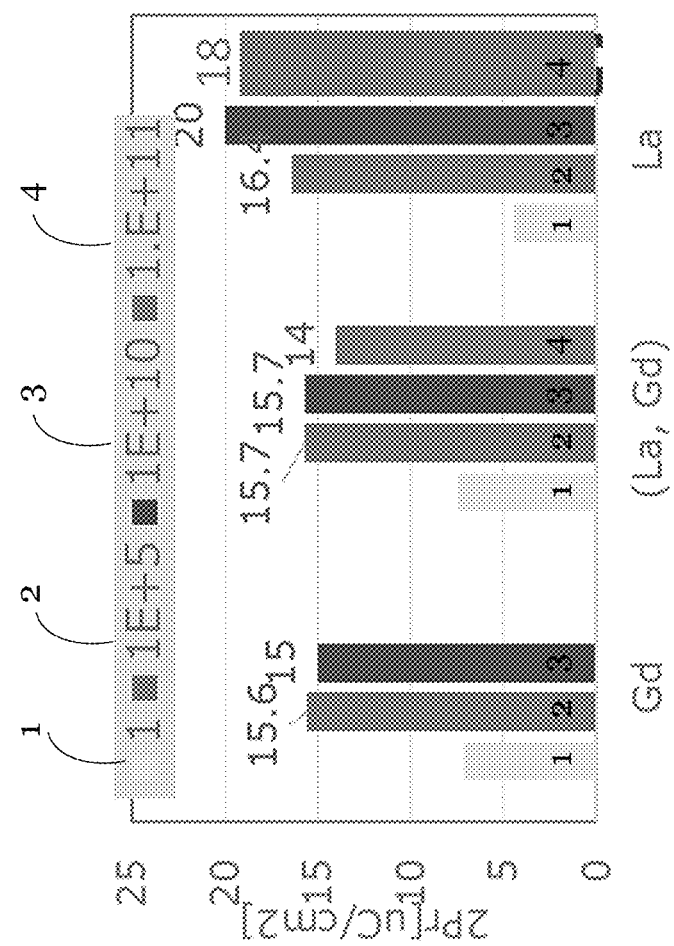
FIG. 4 compares the endurance of a ferroelectric device according to an embodiment of the disclosed technology (co-doped HZO layer) with example ferroelectric devices with only one dopant in the doped HZO layer.

FIG. 4 compares the remnant polarization, for different numbers of cycles, between an example ferroelectric device 10 with a HZO layer 11 co-doped with lanthanum and gadolinium (La, Gd) and example ferroelectric devices with a HZO layer doped either with only lanthanum (La) or with only gadolinium (Gd).

In particular, as can be seen in FIG. 4, using only La as a dopant leads to the highest remnant polarization at 1E+10 cycles. However, also the (La, Gd) co-doping leads to remnant polarizations of above 14 µC/cm² at 1E+5, at 1E+10 cycles, and even at 1E+11 cycles. The endurance achieved with (La, Gd) doping is comparable to that of using only Gd as dopant. However, the (La, Gd) doping achieves a better trade-off between the remnant polarization, the endurance, and the wake-up time. For instance, the remnant polarization achieved with the (La, Gd) doping is already above 6 µC/cm² from the beginning (for example, already from the 1$^{st}$ cycle), and is thus significantly higher than when using only La doping.

In summary, in FIG. 4, the ferroelectric device 10 with the (La, Gd) co-doped HZO layer 11 shows a similar wake-up behavior as the ferroelectric device with the Gd doped HZO layer, while at the same time it is able to maintain a high remnant polarization at a high number of cycles (1E+11 cycles). Further, the ferroelectric device 10 shows a significantly better wake-up behavior than the ferroelectric device with the La doped HZO layer.

Notably, the endurance of the ferroelectric device 10 may be greater than 1E+10 cycles not only for a stoichiometric co-doped HZO layer 11, but also for a Zr-rich or Hf-rich doped HZO layer 11.

In other sets of experiments, the interfacial oxide layer 21 was introduced as described above. For instance, a $ZrO_2$ and $HfO_2$ layer was used, respectively, as the interfacial oxide layer 21 arranged next to the doped HZO layer 11 (thus forming a bi-layer with the doped HZO layer 11). Thereby, stoichiometric HZO (50%), Zr-rich HZO for which the Hf content varies below 50% (down to 43%) and Hf-rich HZO for which the Hf content varies above 50% (up to 57% Hf) was used for the doped HZO layer 11. For each of these alternatives, an endurance of 1E+9-1E+10 cycles with (La, Gd) doping or with (La, Y) doping of the doped HZO layer 11 was measured. Notably, the doped HZO layer 11 may generally have a Hf content, Hf/(Hf+Zr)%, in a range of 40%-70%, for example, in a range of 40%-60%.

Figure 5A:
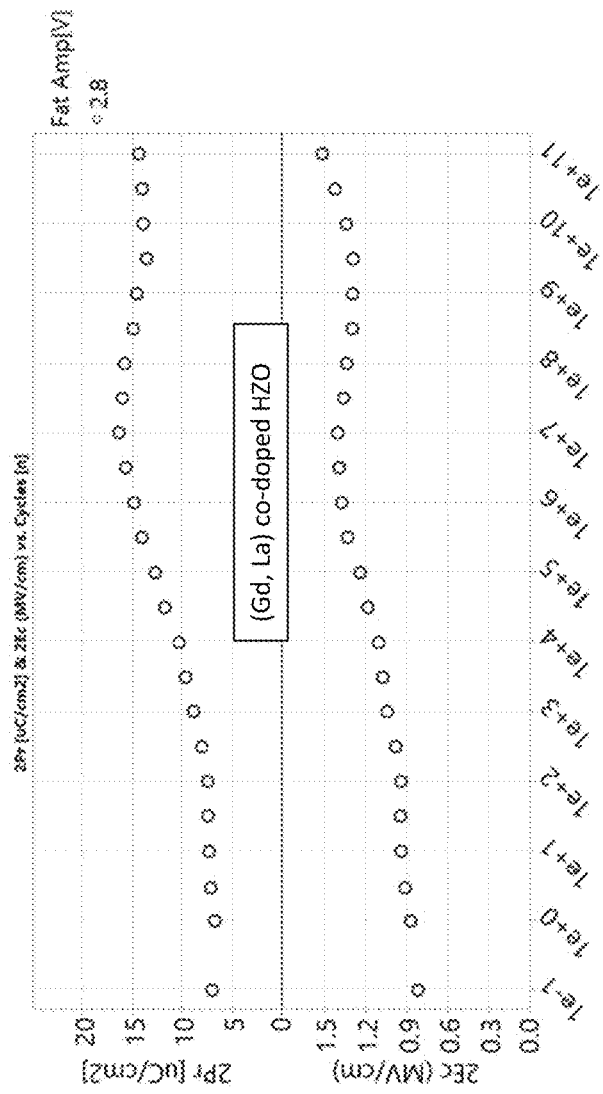
FIG. 5A and FIG. 5B each shows remnant polarization and coercive field (2Ec) versus the number of cycles, demonstrating the fatigue free behavior of the ferroelectric device according to an embodiment of the disclosed technology at for a high number of cycles.

FIG. 5A shows the remnant polarization and coercive field (2Ec) evolution as a function of cycles for the (La, Gd) doped HZO layer 11 of the ferroelectric device 10 according to an embodiment of the disclosed technology. Data is shown in FIG. 5A for a fatigue amplitude of 2.8V.

FIG. 5A demonstrates, in particular, the nearly fatigue free behaviour of the ferroelectric device 10 with the (La, Gd) co-doped HZO layer 11, up to 1E+11 cycles. Thereby, the remnant polarization is maintained at values higher than 14 µC/cm². Further, in this example, no impact of leakage is seen.

Figure 5B:
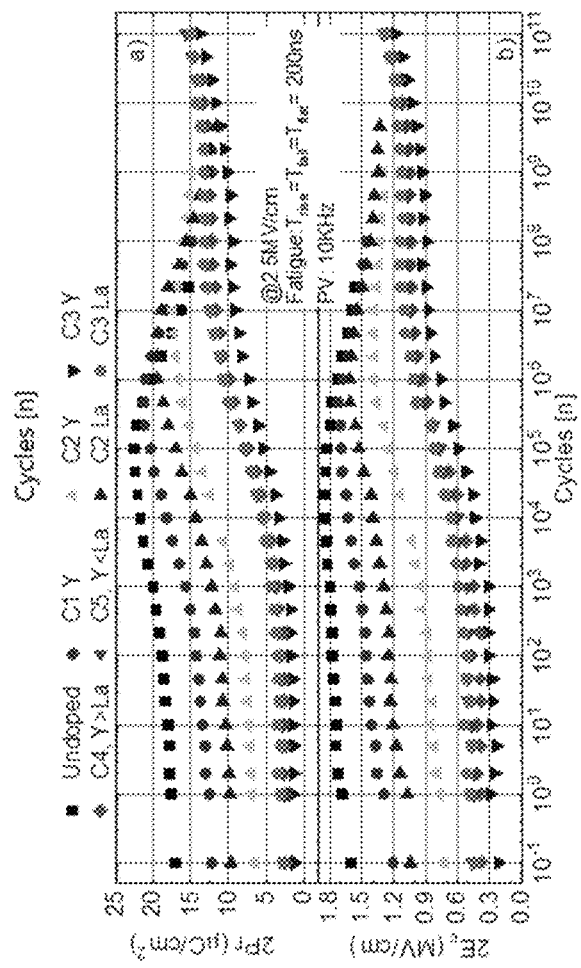

FIG. 5B shows similar results for a ferroelectric device 10 with a (La, Y) doped HZO layer 11 ("C4 Y>La" and "C5 Y<La", wherein the doping concentration of Y is higher or lower than that of La) in comparison with a doping using only yttrium ("C1 Y", "C2 Y", "C3 Y") and only lanthanum ("C2 La", C3 La"). Again a fatigue free behavior with a high remnant polarization can be observed up to 1E+11 cycles. Similar results may be also achieved for a ferroelectric device 10 with a (La, Sc) co-doped HZO layer 11.

Figure 6A:
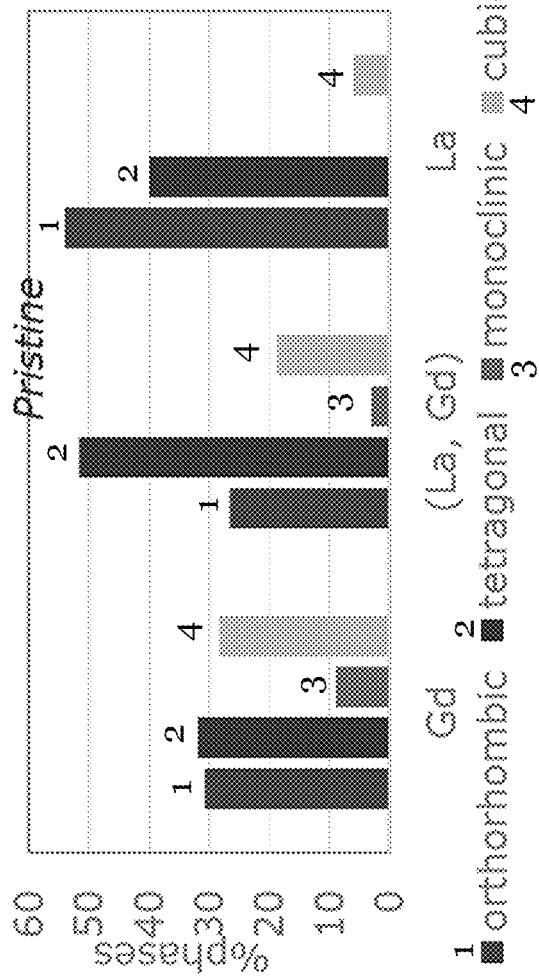
FIG. 6A and FIG. 6B each compares the different phase contents in the doped HZO layer of a ferroelectric device according to an embodiment of the disclosed technology with example ferroelectric devices with only one dopant in the doped HZO layer.

FIG. 6A shows, for the ferroelectric devices and HZO layers compared in FIG. 4, the respective phase ratios (in %) of the different phases and in dependence of the selected dopants (all in pristine state). In particular, it can be seen in FIG. 6A that for the (La, Gd) doped HZO layer 11 of the ferroelectric device 10 according to an embodiment of the disclosed technology, the tetragonal phase is dominant (above 50%), while it is below 50% for the example ferroelectric devices with the HZO layers including only one dopant (La) or (Gd). Overall, the (La, Gd) doped HZO layer 11 behaves similar to the only Gd doped HZO layer, but has a higher percentage of the tetragonal phase. Accordingly, the Gd doped HZO layer has a slightly higher percentage of the orthorhombic and cubic phases than the (La, Gd) doped HZO layer 11. The (La, Gd) co-doping can increase the tetragonal phases and reduce the monoclinic phase.

Figure 6B:
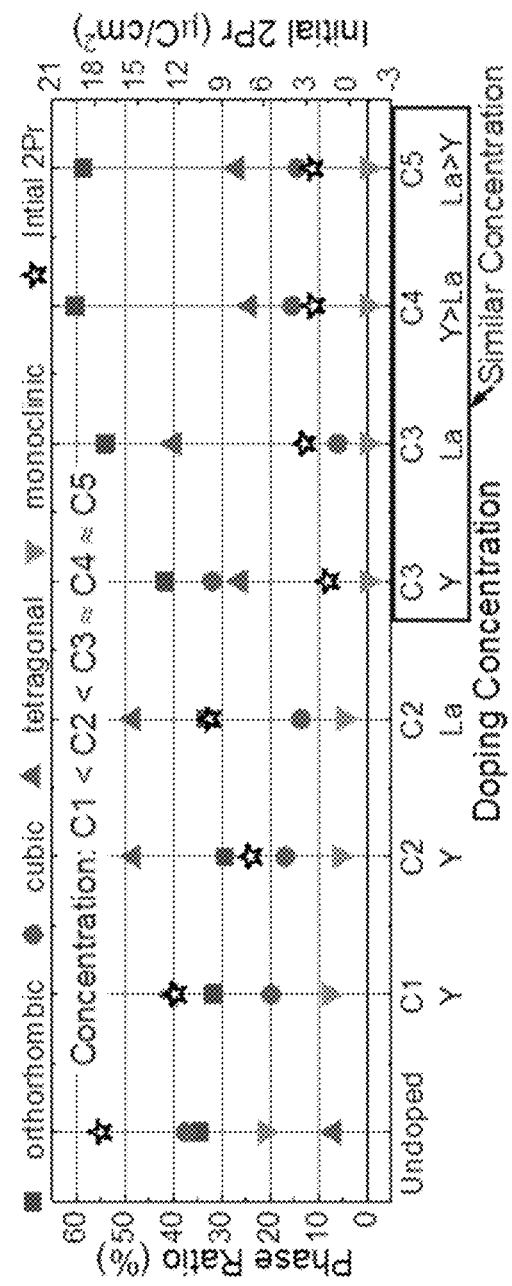

FIG. 6B shows similar results to those shown in FIG. 6A, but for the ferroelectric devices compared in FIG. 5B. For example, FIG. 6B compares the ferroelectric devices 10 with (La, Y) co-doped HZO layers 11 (rightmost results; "C4 Y>La" and "C5 La>Y"), with the example ferroelectric devices with a HZO layer doped only with Y or La ("C1 Y", "C2 Y", "C2 La", "C3 Y", "C3 La"). FIG. 6B shows, in particular, both the phase ratios of the different HZO layers and the initial remnant polarizations (for example, the remnant polarization in the pristine state).

Notably, the at least two different dopants used for doping the HZO layer 11 of the ferroelectric device 10 may have a different atomic radius. For instance, lanthanum ($La3^+$) may have a radius of 1.16 Å, and gadolinium ($Gd3^+$) may have a radius of 1.05 Å. This may induce distortion of the lattice parameter and, accordingly, the formation of a high-symmetry phase paraelectric cubic may be reduced and/or avoided. Moreover, the formation of the detrimental non-polar monoclinic phase, known to result in a reduced bandgap (thus an increased leakage), may be reduced and/or suppressed during deposition of HZO and the dopants, as well as after a post-metallization anneal. The post-metallization anneal may include annealing the doped HZO layer 11, which is arranged between the first electrode 12 and the second electrode 13, at a temperature in a range of 400° C.-650° C., for example, in a range of 500-550°.

Figure 7:
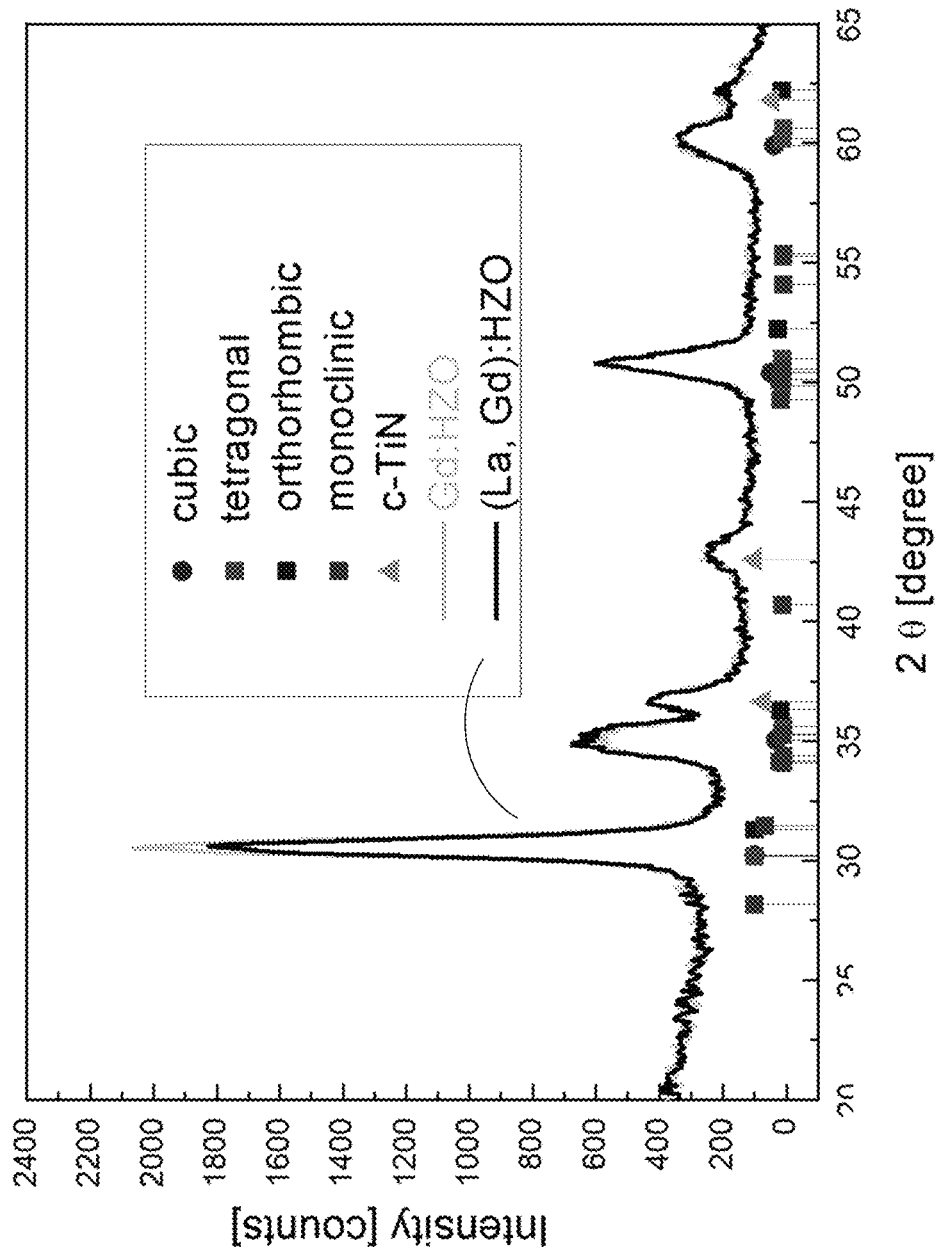
FIG. 7 shows a grazing incidence X-ray diffraction (GIXRD) pattern measured on the doped HZO layer of a ferroelectric device according to an embodiment of the disclosed technology.

FIG. 7 shows in this respect, results of performing grazing incidence X-ray diffraction (GIXRD) experiments on the doped HZO layer 11 of the ferroelectric device 10. The GIXRD pattern is particularly obtained for doping the HZO matrix with lanthanum and gadolinium, in order to obtain the doped HZO layer 11.

Rietveld refinement analysis applied to the GIXRD patterns shown in FIG. 7 allowed the phase quantification as shown in FIG. 6A. As such, the presence of around 30% (for Gd doped HZO) or around 50% of a tetragonal phase (for (La, Gd) doped HZO), can be potentially fully converted into the orthorhombic phase (already present as 20-30%) upon application of an electric field. Therefore, a high polarization can be maintained at higher endurance based on this phase conversion mechanism (tetragonal to orthorhombic).

Figure 8:
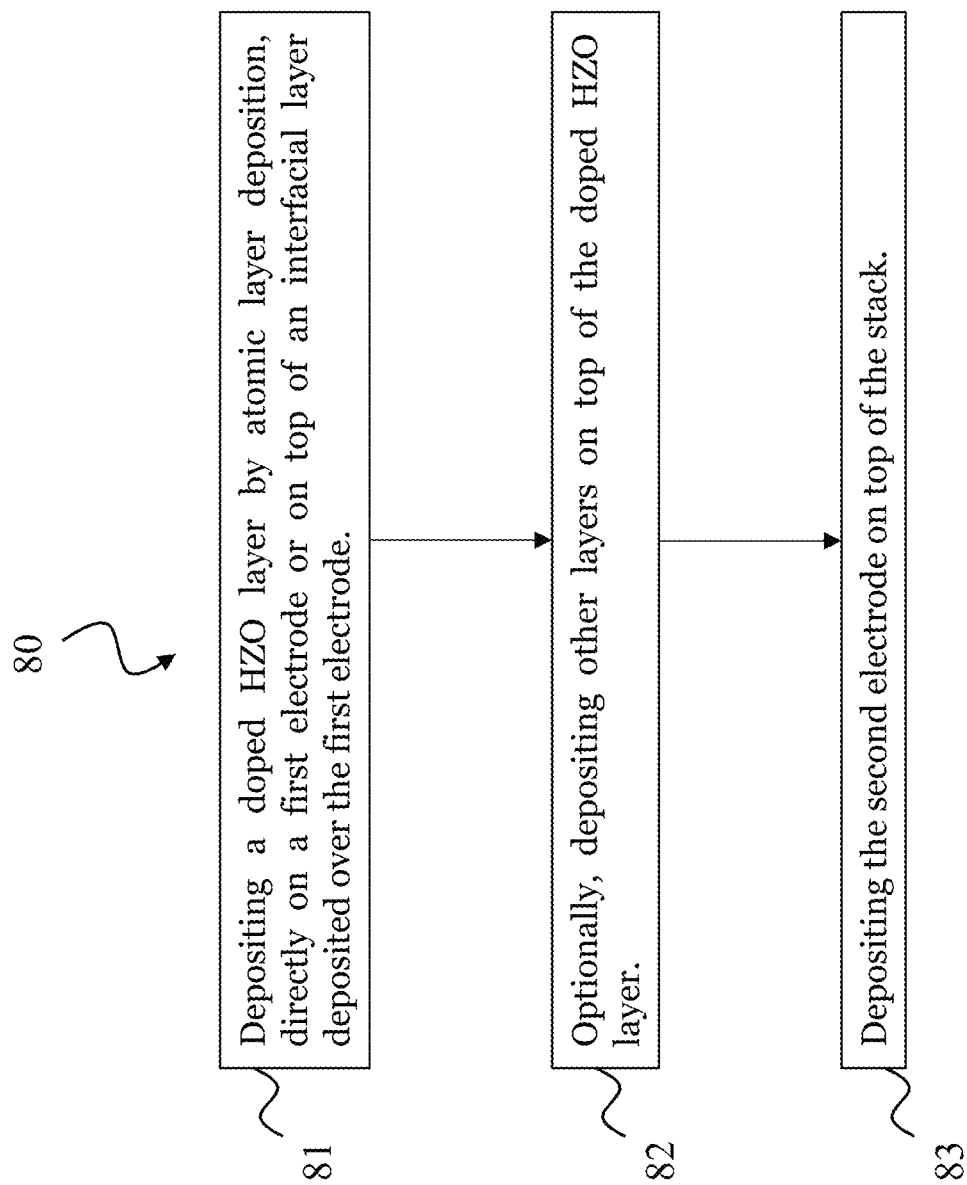
FIG. 8 shows a flow-diagram of a method according to an embodiment of the disclosed technology to manufacture a ferroelectric device.

FIG. 8 shows a method 80 according to an example embodiment of the disclosed technology. The method 80 is for fabricating a ferroelectric device 10, for example, one of the ferroelectric devices 10 described above. The method 80 includes a step 81 of depositing a doped HZO layer 11, for example, by atomic layer deposition, directly on a first electrode 12, or on top of an interfacial layer 21 deposited over the first electrode 12. The method may further include a step 82 of, optionally, depositing other layers, for example, an interfacial layer 21 and an additional layer 31 as described above, on the doped HZO layer 11. In another step 83, the second electrode 13 can be deposited on top of the stack. The doped HZO layer 11 can be a ferroelectric layer and have at least two non-zero remnant polarization charge states. The step of depositing the HZO layer 11 can include doping the HZO layer with at least two different elements from the lanthanide series, or with a combination of at least one element selected from the lanthanide series and at least one rare earth element. The doped HZO layer 11 may be formed in-situ by depositing a plurality of layers grown by atomic layer deposition of HZO and of the dopants, respectively, by alternating the layers of HZO and the layers of each dopant or of multiple dopants, as described above.

In particular, in all the above ferroelectric devices 10 according to embodiments of the disclosed technology, when forming the doped HZO layer 11, the dopants may be inserted into the un-doped HZO (matrix) using in-situ deposition. In particular, the doped HZO layer 11 may be formed in-situ by depositing a plurality of layers grown by atomic layer deposition of HZO and of the dopants, respectively, by alternating the layers of HZO and the layers of each dopant or of multiple dopants. For instance, a 5 nm un-doped HZO layer, then 2 atomic layers of Gd, then 1 atomic layer of La, then again 5 nm un-doped HZO, and so on, can be grown to form the doped HZO layer 11. Notably, the La and Gd doping may be partially crystallized as deposited.

The atomic layers of the HZO and of the dopants may each be deposited at a temperature in a range of 150° C.-400° C. $H_2O$ may thereby be used as an oxidant. For depositing the dopants, a dopant precursor may be used, for instance, Lola' (Air Liquide) or Gd('PrCp)3 (Versum Materials). The dopants may, for example, be deposited at a deposition temperature of around 250° C. The un-doped HZO may be deposited at a deposition temperature of around 300° C. (for example, in an adjacent reactor with $HfCl_4$ or $ZrCl_4$ precursors). The whole stack may be deposited without an air-break, thus reducing and/or ensuring no contamination coming from atmosphere. Simultaneously, the optimal thermal budget for each of the deposited layers may be secured by the two different temperatures.

The ferroelectric device 10 according to embodiments of the disclosed technology may be at least one of a MFM capacitor, a Fe-RAM, and a FeFET. A MFM capacitor can be used in nonvolatile memory applications, for example, as a storage capacitor in a 1T1C nonvolatile DRAM, or as a capacitor on top of the gate of a FET (so-called MFMIS FET device), which can be used as the basic memory cell in 2D or 3D configurations. Also Machine Learning or other so-called Compute-in-Memory (CiM) applications can use such MFM capacitors in the same configuration as used in memory technology (MFMIS or 1T1C) or also in 2T1C configurations similar to those using 2T DRAM cells or related schemes using IGZO for transistors.

While methods and processes may be depicted in the drawings and/or described in a particular order, it is to be recognized that the steps need not be performed in the particular order shown or in sequential order, or that all illustrated steps be performed, to achieve desirable results. Further, other steps that are not depicted may be incorporated in the example methods and processes that are schematically illustrated. For example, one or more additional steps may be performed before, after, simultaneously, or between any of the illustrated steps. Additionally, the steps may be rearranged or reordered in other embodiments.

In the above the disclosed technology has mainly been described with reference to a limited number of examples. However, as is readily appreciated by a person skilled in the art, other examples than the ones disclosed above are equally possible within the scope of the disclosed technology.

What is claimed is:

1. A ferro electric device, comprising:
    a first electrode and a second electrode;
    a doped hafnium zirconate (HZO) layer, which is arranged between the first electrode and the second electrode, wherein the doped HZO layer is a ferroelectric layer and has at least two non-zero remnant polarization charge states;
    wherein the doped HZO layer is doped with at least two different elements selected from the lanthanide series, or with a combination of at least one element selected from the lanthanide series and at least one rare earth element.

2. The ferroelectric device according to claim 1, wherein the doped HZO layer is doped with at least lanthanum and gadolinium.

3. The ferroelectric device according to claim 1, wherein the doped HZO layer is doped with at least lanthanum and with at least yttrium or scandium.

4. The ferroelectric device according to claim 1, wherein a total dopant concentration in the doped HZO layer is equal to or smaller than 2 atomic %.

5. The ferroelectric device according to claim 4, wherein the total dopant concentration in the doped HZO layer is in a range of 0.7 to 1.8 atomic %.

6. The ferroelectric device according to claim 1, wherein the thickness of the doped HZO layer is between 5 and 13 nm.

7. The ferroelectric device according to claim 6, wherein the thickness of the doped HZO layer is between 8.5 and 12.5 nm.

8. The ferroelectric device according to claim 1, wherein the doped HZO layer has a hafnium content, Hf/(Hf+Zr)%, in a range of 40%-70%.

9. The ferroelectric device according to claim 8, wherein the doped HZO layer has a hafnium content in a range of 40%-60%.

10. The ferroelectric device according to claim 1, further comprising:
    an interfacial oxide layer arranged between one of the electrodes and the doped HZO layer;
    wherein the interfacial oxide layer comprises a layer of $ZrO_2$ or $HfO_2$ or Zr-rich HZO or Hf-rich HZO.

11. The ferroelectric device according to claim 10, wherein the interfacial oxide layer is a zirconium dioxide layer, and wherein the hafnium content, Hf/(Hf+Zr)%, of the doped HZO layer is in a range of 50-70%.

12. The ferroelectric device according to claim 10, wherein the interfacial oxide layer is doped with at least one element from the lanthanide series and/or a rare earth element.

13. The ferroelectric device according to claim 1, wherein a remnant polarization of the doped HZO layer of at least 10 $\mu C/cm^2$ is maintained when the endurance is equal to or greater than 1E+5 cycles.

14. The ferroelectric device according to claim 1, wherein the ferroelectric device is a metal-ferroelectric-metal capacitor and/or a ferroelectric random access memory and/or a ferroelectric field effect transistor.

15. The ferroelectric device according to claim 14, further comprising an indium gallium zinc oxide layer or indium tin oxide layer arranged between the doped HZO layer and one of the electrodes.

16. The ferroelectric device according to claim 1, wherein the doped HZO layer comprises predominantly orthorhombic and tetragonal phase content.

17. A method of fabricating a ferroelectric device, the method comprising:
    forming at least a doped hafnium zirconate (HZO) layer between a first electrode and a second electrode, wherein the doped HZO layer is a ferroelectric layer and has at least two non-zero remnant polarization charge states;

wherein the forming of the doped HZO layer comprises doping HZO with at least two different elements from the lanthanide series, or with a combination of at least one element selected from the lanthanide series and at least one rare earth element.

18. The method according to claim 17, wherein the doped HZO layer is formed in-situ by depositing a plurality of layers grown by atomic layer deposition of HZO and of the dopants, respectively, by alternating the layers of HZO and the layers of each dopant or of multiple dopants.

19. The method according to claim 18, wherein the layers of the HZO and of the dopants are each deposited at a temperature in a range of 150° C.-400° C.

20. The method according to claim 19, further comprising annealing the doped HZO layer at a temperature in a range of 400° C.-650° C.

21. The method according to claim 20, further comprising annealing the doped HZO layer at a temperature in a range of 500-550° C.

* * * * *